(12) United States Patent
Iwata

(10) Patent No.: US 7,038,359 B2
(45) Date of Patent: May 2, 2006

(54) PIEZOELECTRIC RESONATOR AND THE METHOD FOR MAKING THE SAME

(75) Inventor: Hirokazu Iwata, Kawasaki (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 103 days.

(21) Appl. No.: 10/625,478

(22) Filed: Jul. 22, 2003

(65) Prior Publication Data

US 2004/0130241 A1    Jul. 8, 2004

(30) Foreign Application Priority Data

Jul. 22, 2002  (JP) .............................. 2002-213185

(51) Int. Cl.
*H01L 41/47* (2006.01)

(52) U.S. Cl. .................. 310/366; 310/320; 310/324; 310/360; 310/361

(58) Field of Classification Search ................ 310/320, 310/324, 360, 361, 366; 29/25.35
See application file for complete search history.

(56) References Cited

U.S. PATENT DOCUMENTS

| | | | | |
|---|---|---|---|---|
| 2,969,512 A | * | 1/1961 | Jaffe et al. .................. 333/187 |
| 3,384,279 A | * | 5/1968 | Grechus ....................... 225/2 |
| 4,184,095 A | * | 1/1980 | Stacchiotti et al. ......... 310/366 |
| 4,584,590 A | * | 4/1986 | Fischbeck et al. ............ 347/69 |
| 4,628,285 A | * | 12/1986 | Nakatani et al. ............ 331/163 |
| 5,122,993 A | * | 6/1992 | Hikita et al. ................ 367/155 |
| 5,696,423 A | * | 12/1997 | Dydyk et al. ............... 310/346 |
| 6,750,593 B1 | * | 6/2004 | Iwata ......................... 310/321 |

FOREIGN PATENT DOCUMENTS

| | | | |
|---|---|---|---|
| JP | 2002-324870 | * | 11/2002 |
| JP | 2004-349564 | * | 5/2003 |
| JP | 2004-194046 | * | 7/2004 |

* cited by examiner

*Primary Examiner*—Thomas M. Dougherty
(74) *Attorney, Agent, or Firm*—Darby & Darby

(57) ABSTRACT

The present invention provides a method for making high-frequency piezoelectric resonators so that constants of the resonator can be measured precisely. A cavity is formed at a central section of an AT-cut crystal substrate. Two grooves are formed at predetermined distances from the left and right of the cavity, and two more grooves are formed at predetermined distances outward from these two grooves. Two more grooves perpendicular to the first set of grooves are formed. A pair of main electrodes and a pair of secondary electrodes shorted to ground and surrounding the main electrodes are disposed at roughly the center of the crystal substrate. One main electrode and one secondary electrode are used as inputs and the other main electrode and secondary electrode are used as outputs, with these two terminal pairs being used to measure and adjust a frequency.

4 Claims, 6 Drawing Sheets

US 7,038,359 B2

PIEZOELECTRIC RESONATOR AND THE METHOD FOR MAKING THE SAME

FIELD OF THE INVENTION

The present invention relates to a piezoelectric resonator, especially to an improved fundamental wave piezoelectric resonator in which precise measurements for frequency and constants can be measured.

BACKGROUND OF THE INVENTION

Piezoelectric resonators are widely used in electric circuits because, not only are they small and light, but also they are more stable in frequency and suffer less change over time than other electric parts. Among piezoelectric resonators, high-frequency crystal resonators, in which a cavity is formed in a part of a crystal substrate, are currently used especially for VHF and UHF bands.

FIG. 3(a) shows a plan drawing of a conventional high-frequency quartz resonator 30 and FIG. 3(b) is a cross section figure of the conventional high-frequency quarts resonator 30 at the 3(b)—3(b) plane. A cavity 32 is formed by photolithography and etching in the center of one of the main facets of an AT-cut crystal substrate 31 wherein the cavity 32 is a resonator. An electrode 33a is formed in the flat side of the crystal substrate 31, and a lead electrode 34a extends from the electrode 33a to the edge of the crystal substrate 31 and connects to a pad electrode 35a. Further an electrode 33b is formed in the cavity 32 facing against to the electrode 33a, wherein a lead electrode 34b extends from the electrode 33b to the edge of the crystal substrate and connects to a pad electrode 35b to form a high-frequency resonator 30. It has been known that the resonant frequency of a high-frequency crystal resonator 30 is inversely proportional to the thickness of the vibrate portion of the cavity 32, and the levelness and the flatness of the cavity 32 are known to have great influences on the various characteristics of the high-frequency crystal resonator 30 and the spurious output near the resonance frequency.

When a high-frequency crystal resonator is used in a voltage-controlled crystal oscillator (VCXO), it is preferable to drive the resonator on the fundamental mode in order to widen the variable range of the frequency and not to deteriorate the capacitance ratio of the crystal resonator.

FIG. 4 shows another conventional high-frequency crystal resonator 30' that has been improved to suppress spurious appearing near the resonance frequency of the high-frequency crystal resonator shown in FIG. 3. A pair of secondary electrodes 36a and 36b are formed with a gap around a pair of main electrodes 33a and 33b. The secondary electrodes 36a and 36b are short-circuited each other, and may be grounded so that the shield effect between input and output terminals are brought about by the secondary electrode 36a and 36b.

In these high-frequency vibratos 30', it was more difficult to measure various constants accurately at higher frequencies because the various constants are measured by a method using a π circuit through the pair of electrode pads 35a, 35b connecting with the lead electrodes 34a, 34b, and the extending from the main electrodes 33a, 33b. The measurements are prone to the influence of floating capacitance and the like. For example, the IEC standards for π circuit measurements set the upper limit of the measurement to be 125 MHz, and it is not possible to precisely measure for higher frequencies beyond that upper limit.

OBJECT AND SUMMARY OF THE INVENTION

The object of the present invention is to overcome these problems and to provide a piezoelectric resonator that allows precise measurement of resonance frequencies of high-frequency crystal resonators such as 600. MHz crystal resonators.

In order to achieve this object, the present invention provides a method for making crystal resonators including an AT-cut crystal substrate, a pair of electrodes disposed roughly at the center thereof, and a pair of secondary electrodes, which are formed in a shape surrounding the primary electrodes and are electrically short-circuited. The method of the present invention includes: a step for grounding the secondary electrodes and measuring a frequency of a two-terminal pair circuit, with a primary electrode and the secondary electrodes serving as output terminals and another primary electrode and the secondary electrodes serving as output terminals; and a step for performing frequency adjustments when there is a difference between a measured frequency and a desired frequency.

An embodiment of the present invention provides a method for making crystal resonators including an AT-cut crystal substrate including a cavity formed on one main surface thereof, a pair of primary electrodes disposed roughly at the center of the cavity, and a pair of secondary electrodes, which are formed in a shape surrounding the primary electrodes and are electrically short-circuited. This method includes: a step for forming on one main surface of the AT-cut crystal substrate a cavity, first and second grooves disposed rightward and leftward from the cavity, third and fourth grooves disposed on either outer side of the first and second grooves, and fifth and sixth grooves formed above and below the cavity; a step for grounding the secondary electrodes; and a step for measuring a frequency of a two terminal pair circuit and performing frequency-adjustment if there is a difference between a measured frequency and a desired frequency, an input terminal for the measuring being formed by respectively connecting two pad electrodes disposed at positions between the first and third grooves with one primary electrode and the secondary electrodes, and an output terminal for the measuring being formed by respectively connecting two pad electrodes disposed at position between the second and fourth grooves with another primary electrode and the secondary electrodes.

In another embodiment of the present invention, individual crystal resonators are obtained by dividing along the first, second, fifth, and sixth grooves.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

The embodiments of the present invention are explained using the figures.

Figure 1A:
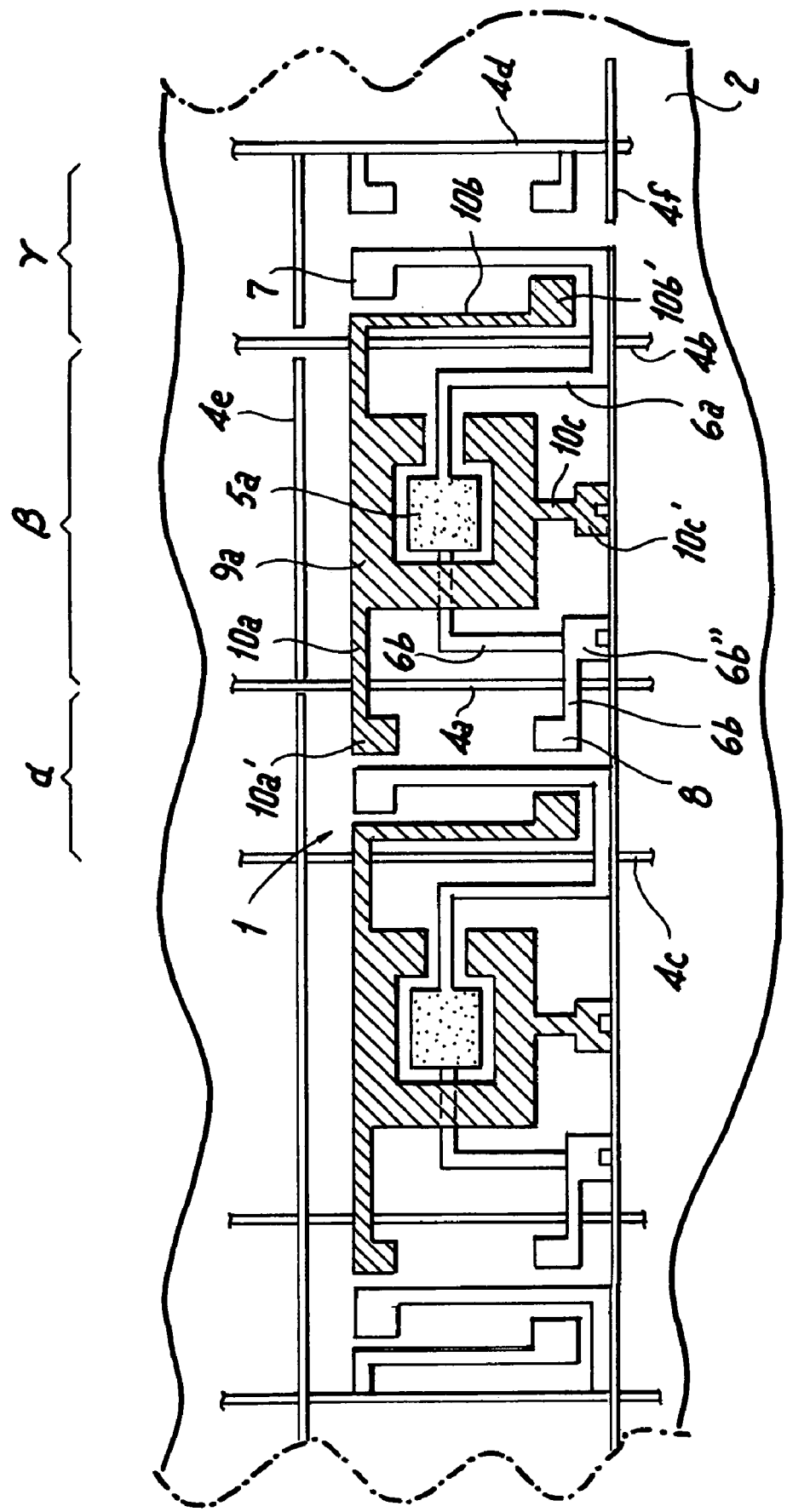
FIG. 1(a) is a front plan view drawing of high-frequency crystal resonators arranged as a matrix on an AT-cut crystal substrate according to an embodiment of the present invention.
Figure 1B:
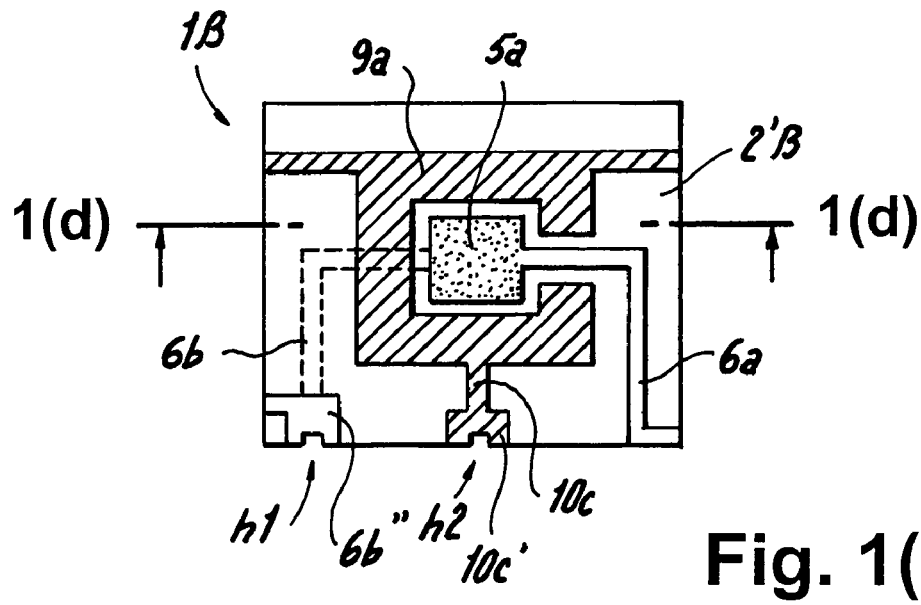
FIG. 1(b) is a front plan view drawing of a high-frequency crystal resonator which is separated to an individual piece of the AT-cut crystal substrate of FIG. 1(b)
Figure 1C:
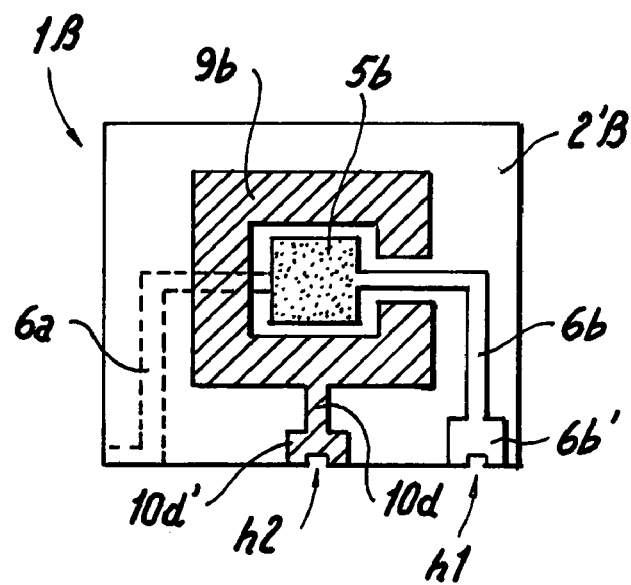
FIG. 1(c) is a back view of the high-frequency crystal resonator of FIG. 1(b)
Figure 1D:
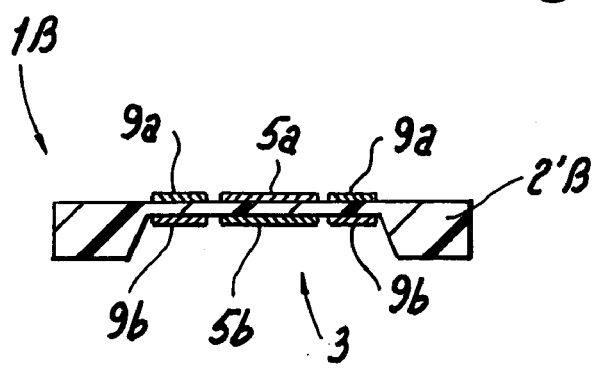
FIG. 1(d) is a cross sectional view taken at the 1(d)—1(d) plane of the high-frequency crystal resonator of FIG. 1(b)

FIGS. 1(a), 1(b), 1(c), 1(d) show the composition of a high-frequency crystal resonator according to the present invention, wherein FIG. 1(a) is a plan drawing of an AT-cut crystal wafer 2, on which many high-frequency crystal resonators 1 are formed in a matrix-like arrangement. FIG. 1(b) is a plan drawing (front view) of a single high-frequency crystal resonator 1β which is cut out from the crystal wafer 2 individually and FIG. 1(c) is a back view of the high-frequency crystal resonator 1β of FIG. 1(b). FIG. 1(d) is a cross section of the high-frequency crystal resonator 1β taken at the 1(d)—1(d) plane.

The high-frequency crystal resonators 1 of the present invention are formed on the crystal wafer 2 in a matrix-like arrangement. Here, however, a unit of a high-frequency crystal resonator 1 is explained for the sake of simplicity. At first, a cavity 3 with a predetermined thickness is formed by photolithography and etching at roughly the center of one surface of the AT-cut crystal wafer 2. Also, first and second grooves 4a and 4b are formed on the crystal wafer 2 at predetermined distances from the left and right of the cavity 3. Third and fourth grooves 4c and 4d are formed at predetermined distances outward from the first and second grooves 4a and 4b. Furthermore, fifth and sixth grooves 4e and 4f are formed perpendicular to the first groove 4a and the second groove 4b to form a crystal substrate 2' to be used for the single high-frequency crystal resonator 1β. The crystal substrate 2' is comprised of parts α, β, γ as shown in FIG. 1(a) and are also referred to as crystal substrates 2'α, 2'β, 2'γ. The parts α, β, γ are divided by the grooves 4a, 4b, 4c, 4d, 4e and 4f formed by etching for breaking off the crystal substrates. The cavity 3 is formed by etching at the rear center of β (called crystal substrate 2'β).

An electrode 5a is attached to the flat side of a crystal substrate 2' made as described above, and another electrode 5b is attached to the cavity 3, at the opposite side of the crystal substrate 2' as electrode 5a. Lead electrodes 6a and 6b extend from the electrode 5a and 5b to the edges of the crystal substrate 2'β. Furthermore, the lead electrode 6a extends to the edge of the crystal substrate 2'γ and connects to a pad electrode 7 for measurement. The lead electrode 6b in the reverse side extends to the terminal electrode 6b' located at the edge of the substrate 2'β, and the terminal electrode 6b' is connected to a terminal electrodes 6b" by way of the metal plating of a through hole h1. In addition, the terminal electrode 6b" is connected to a pad electrode 8 for measurement which is formed at the edge of the crystal substrate 2'α.

A pair of secondary electrodes 9a and 9b are formed surrounding the driving electrodes 5a, 5b with a gap between each driving electrode 5a, 5b and lead electrodes 10a and 10b extend from the left and right edge of the secondary electrode 9a to the edge of the crystal substrate 2'β. The lead electrodes 10a and 10b extend over the crystal substrates 2'α and 2'γ and connect to the pad electrodes 10a' and 10b' for measurement. Furthermore, the lead electrodes 10c and 10d extend from the secondary electrodes 9a and 9b toward the edge of the crystal substrate 2'β and connect to the terminal electrodes 10c' and 10d' which are formed at the edge of the crystal substrate 2'β. A through hole h2 is formed between the terminal electrodes 10c' and 10d', and the terminal electrodes 10c' and 10d' are electrically connected through the metal plating on the through hole h2.

By forming multiple high-frequency crystal resonators 1, each of which serve as the smallest unit, on the large wafer 2 as shown in FIG. 1(a) and by grounding the terminal 10c', the constants of the crystal resonators 1, each of which serve as the smallest unit, can be measured using the S-parameter method, which is suited for high-frequency measurements. In this case, the pad electrodes 8, 10a' serve as input terminals and the pad electrodes 7, 10b' serve as output terminals. The resulting measurements provide improved accuracy. At the same time, the pad electrodes 8, 10a', 7 and 10b' touched by a probe for measurements are positioned away from each individual resonator 2'β where the resonator is formed, and the pad electrodes 8, 10a', 7 and 10b' are separated from the individual resonator 2'β by the grooves 4a and 4b. Thus, the stress caused by the touch of the probe is moderated, the effect on the resonator 1β is lowered, and the frequency change due to the stress-strain on measurement can be kept very small. The reason why the input pad electrodes 8, 10a' and the output pad electrodes 7, 10b' are placed diagonally to each other is to accommodate the S-parameter probe.

After the measurement of various constants and the adjustment of frequency, if needed, single high-frequency resonators 1β are obtained by separating the grooves 4a, 4b, 4c, 4d on the edges of the crystal substrates 2'α, 2'γ and the grooves 4e and 4f on the edge of the crystal substrate 2'β. The high-frequency crystal resonator 1β is completed by being placed at the bottom of a cavity in a ceramic package, connecting the terminal electrode 10c' of the secondary electrode 9a to the ground terminal, and closing the ceramic package with an airtight metal lid.

Since the secondary electrodes 9a and 9b in the high-frequency crystal resonator 1β in the present embodiment are grounded and the electric potential of the secondary electrodes 9a and 9b is the same as the ground electrode of the package, a resonator 1β with minimum floating capacitance can be obtained. When a VCXO is made by using a high-frequency crystal resonator 1β constructed as above, such as a 600 MHz resonator, the variable range of frequency is widened and frequency stability is improved.

Figure 2A:
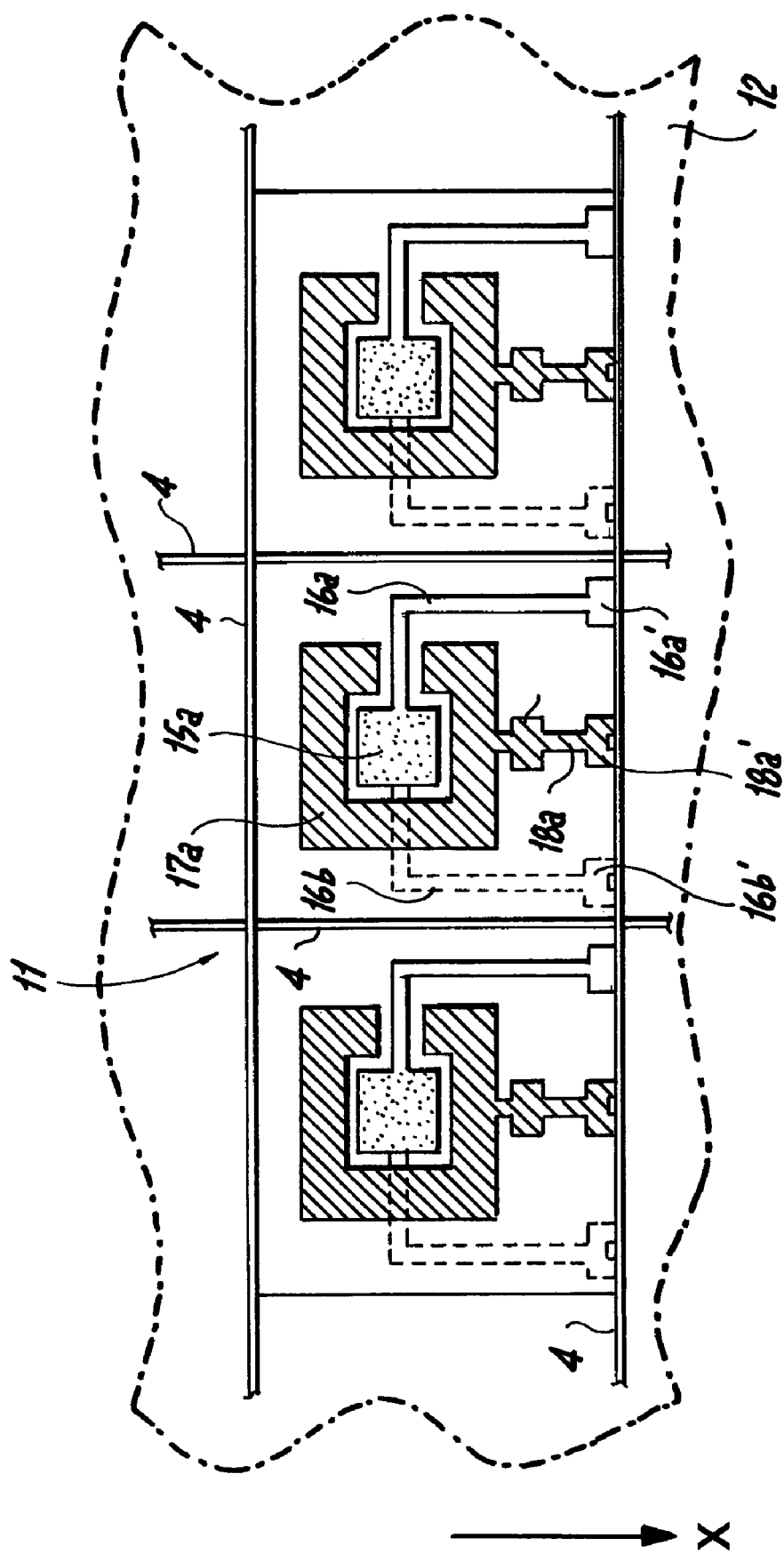
FIG. 2(a) is a front plan view drawing of high-frequency crystal resonators arranged as a matrix on an AT-cut crystal substrate according to another embodiment of the present invention.
Figure 2B:
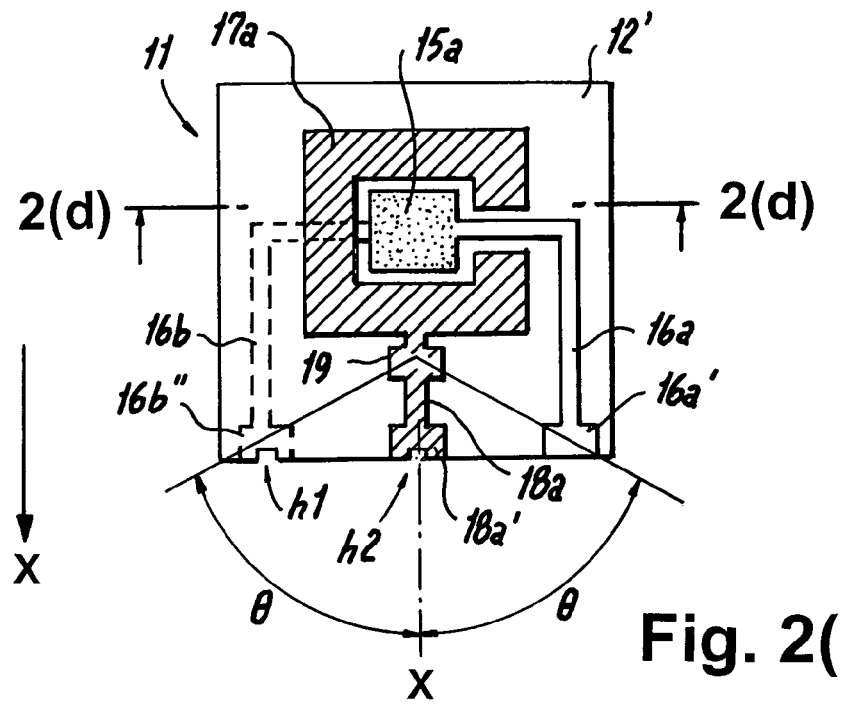
FIG. 2(b) is a front plan view drawing of a high-frequency crystal resonator which is separated to an individual piece of the AT-cut crystal substrate of FIG. 2(a)
Figure 2C:
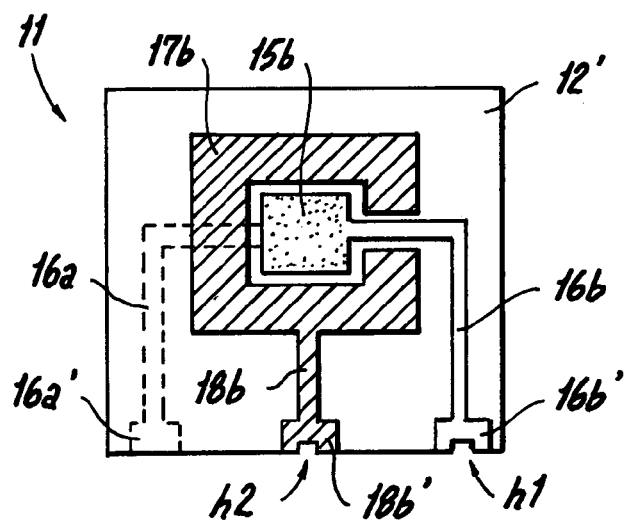
FIG. 2(c) is a back view of the high-frequency crystal resonator of FIG. 2(b)
Figure 2D:
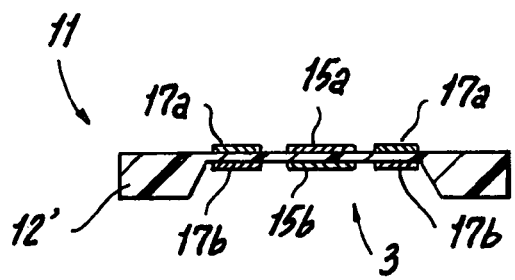
FIG. 2(d) is a cross sectional view taken at the 2(d)—2(d) plane of the high-frequency crystal resonator of FIG. 2(b)
Figure 3A:
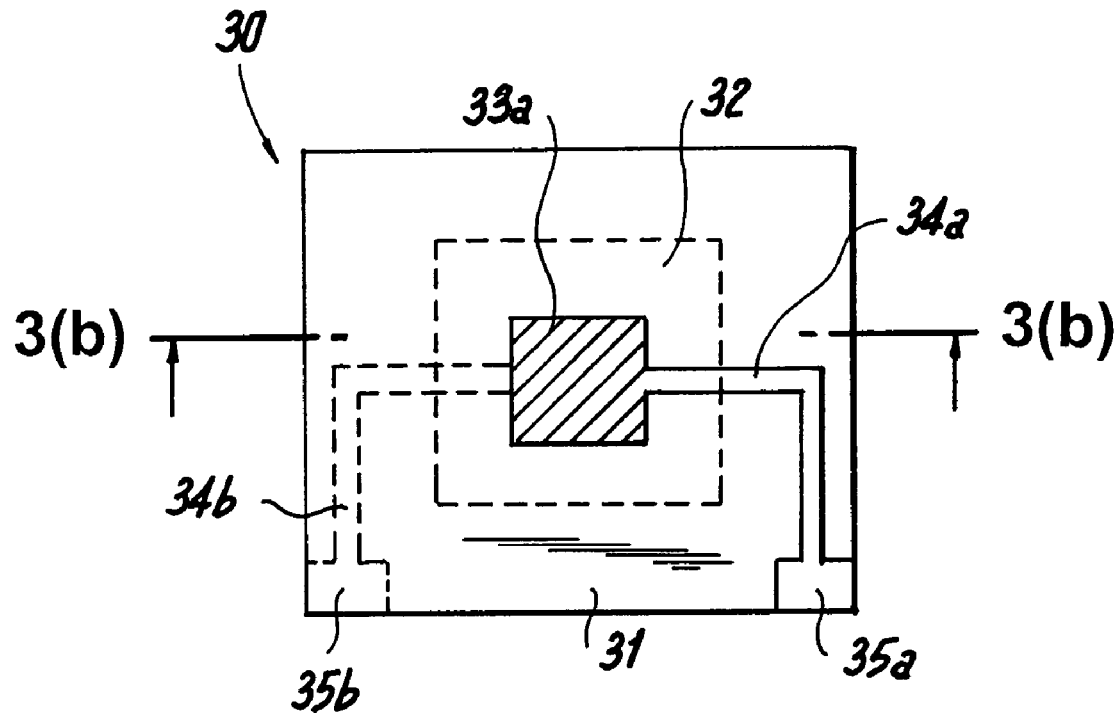
FIG. 3(a) is a front plan view drawing of an example of a conventional high-frequency crystal resonator.
Figure 3B:
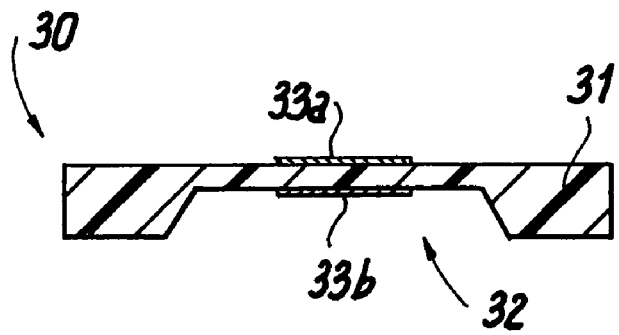
FIG. 3 (b) is a cross sectional view taken at the 3(b)—3(b) plane of the conventional high-frequency crystal resonator of FIG. 3(a)
Figure 4A:
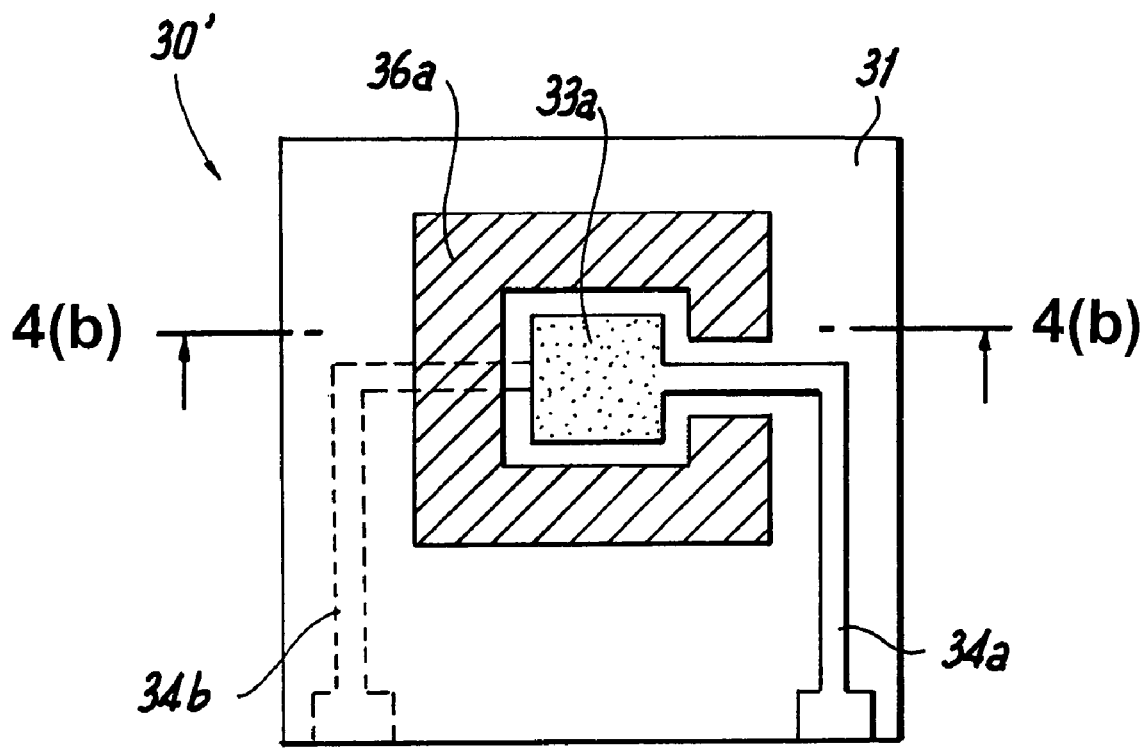
FIG. 4(a) is a front plan view drawing of another example of a conventional high-frequency crystal resonator.
Figure 4B:
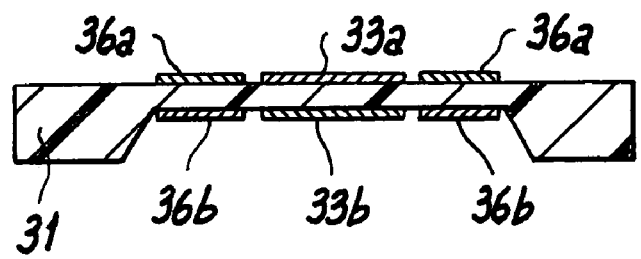
FIG. 4(b) is a cross sectional view taken at the 4(b)—4(b) plane of the conventional high-frequency crystal resonator of FIG. 4(a).

FIGS. 2(a), 2(b), 2(c) show another embodiment of a high-frequency crystal resonator 11. FIG. 2(a) is a plan drawing of an AT-cut crystal wafer 12, on which many high-frequency crystal resonators 11 are formed in a matrix like arrangement by photolithography and etching. FIG. 2(b)

is a plan drawing (front view) of the high-frequency resonator 11 which is cut out from the crystal wafer 12 individually. FIG. 2(c) is a back view of the high-frequency resonator 11 of FIG. 2(b). FIG. 2(d) is a cross section of the high-frequency resonator 11 taken at the 2(d)—2(d) plane. Many of the cavities 3 and grooves 4 for cutting which surround the cavity 3 are formed in a matrix-like arrangement by using a photolithography and etching technique on the AT-cut crystal wafer 12 of a predetermined thickness. One high-frequency crystal resonator 11 on the AT-cut wafer 12 is described for the sake of simplicity. At the back of an individual piece of a crystal substrate 12', a cavity 3 is formed in the center, and the grooves 4 for breaking the AT-cut wafer 12 into individual pieces 12' surround the cavity 3. In the center of the flat side of the crystal substrate 12', a driving electrode 15a is formed and a leading electrode 16a extends from the electrode 15a toward the edge of the crystal substrate 12' and connects to a pad electrode 16a'. An electrode 15b is formed in the cavity 3 facing against to the electrode 15a, and a lead electrode 16b extends from the electrode 15b toward the edge of the crystal substrate 12' and connects to a pad electrode 16b' which is formed at the edge of the backside of the crystal substrate 12'. In front side, a pad electrode 16b" is formed facing to the terminal electrode 16b'. The two electrodes 16b' and 16b" are electrically connected through a through hole h1.

Further, a pair of secondary electrodes. 17a and 17b, which surround the main electrodes 15a and 15b, are formed both side of the resonator 11 facing each other. Lead electrodes 18a and 18b are extend from each secondary electrode 17a and 17b toward the edge of the crystal substrate. 12' and connect to the terminal electrodes 18a' and 18b' which are formed at the edge of the crystal substrate 12'. A through hole h2 is formed between the lead electrodes 18a' and 18b', which are connected electronically through the metal plating on the through hole h2. A pad electrode 19 is formed in the middle of the electrode 18a on the front side wherein an angle θ between the line connecting the pad electrodes 16b" and 19 and the x axis is set to be about 60°, and the angle θ between the line connecting the pad electrodes 16a' and 19 and x axis is also set to be about 60°. Also, the above mentioned angle θ may be set to be 120°. The angle is determined so that the stress-frequency sensitivity is minimized in order to lessen the frequency change due to the stress caused by touching the pad electrodes 16a', 16b" and 19 with a probe for measurement of various constants of the high-frequency crystal resonator. It is also possible to minimize the frequency change from support stress by having the high-frequency crystal resonator 11 supported at the pad electrodes 16b" and 16a' when placing the high-frequency crystal resonator 11 in the ceramic package.

The deterioration of the capacitance ratio due to the floating capacitance can be prevented by grounding the secondary electrodes 9a, 9b, 17a, 17b, and at the same time the spurious output can be effectively suppressed.

The present invention provides an accurate measurement of various constants of the high-frequency crystal resonator. An embodiment of the present invention provides a crystal resonator which is suitable for high frequency voltage controlled crystal oscillators because the floating capacitance can be kept low and the capacitance ratio can be kept small. An embodiment of the present invention provides a crystal resonator with high frequency stability in which the support influence is minimized and deterioration of the capacitance ratio is prevented.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An AT-cut crystal substrate for forming piezoelectric resonators, said AT-cut crystal substrate having first and second opposing surfaces, and comprising:

first and second primary electrodes disposed roughly on the center of each respective opposing surface of said AT-cut crystal substrate;

first and second secondary electrodes formed on each respective opposing surface of said AT-cut crystal substrate in a shape surrounding each of said first and second primary electrodes and are electrically short-circuited; and said first and second said secondary electrodes connected to an electrical ground, wherein input measurement terminals are formed by one of said first and second primary electrodes and a corresponding secondary electrode, and output measurement terminals are formed by another of said first and second primary electrodes and another corresponding secondary electrode, and wherein said input measurement terminals disposed leftward from said center of the AT-cut crystal substrate and said output measurement terminals disposed rightward from said center of the AT-cut crystal substrate.

2. An AT-cut crystal substrate for forming piezoelectric resonators, said AT-cut crystal substrate comprising:

a cavity formed on one main surface of said AT-cut crystal substrate;

a pair of primary electrodes aligned roughly to the center of said cavity;

a pair of secondary electrodes, which are, formed in a shape surrounding said primary electrodes, and are electrically short-circuited, said secondary electrodes being grounded;

first and second grooves disposed rightward and leftward from said cavity;

third and fourth grooves disposed on either outer side of said first and second grooves;

fifth and sixth grooves formed perpendicularly to the first and the second grooves;

an input terminal for measuring formed by respectively connecting a first pair of pad electrodes disposed at positions between said first and third grooves with one of said pair of primary electrodes and said secondary electrodes; and an output terminal for said measuring formed by respectively connecting a second pair of pad electrodes disposed between said second and fourth grooves with the other of said pair of primary electrodes and said secondary electrodes.

3. The AT-cut crystal substrate as described in claim 2, wherein one of said piezoelectric resonators is obtained by dividing along said first, second, fifth, and sixth grooves.

4. An AT-cut crystal substrate for forming piezoelectric resonators, said AT-cut crystal substrate having first and second opposing surfaces, and comprising:

first and second primary electrodes disposed roughly on the center of each respective opposing surface of said AT-cut crystal substrate;

first and second secondary electrodes formed on each respective opposing surface of said AT-cut crystal substrate in a shape surrounding each of said first and second primary electrodes and are electrically short-circuited by a lead electrode;

said first and second secondary electrodes connected to an electrical ground, and a pad electrode formed roughly at the midpoint of the path of said lead electrode on one of first and second respective opposing surfaces of said AT-cut crystal substrate, wherein input measurement terminals are formed by one of said first and second primary electrodes and said pad electrode, and output measurement terminals are formed by another of said first and second primary electrodes and said pad electrode.

* * * * *